United States Patent [19]

Takla

[11] Patent Number: 5,570,053
[45] Date of Patent: Oct. 29, 1996

[54] METHOD AND APPARATUS FOR AVERAGING CLOCK SKEWING IN CLOCK DISTRIBUTION NETWORK

[75] Inventor: Ashraf K. Takla, San Jose, Calif.

[73] Assignee: Hitachi Micro Systems, Inc., San Jose, Calif.

[21] Appl. No.: 312,026

[22] Filed: Sep. 26, 1994

[51] Int. Cl.⁶ .................. H03L 7/00; H03L 7/18
[52] U.S. Cl. .................. 327/292; 327/295; 327/157; 327/158; 327/244
[58] Field of Search .............. 327/141, 144–150, 327/152, 153, 155–159, 161, 231, 233–237, 243–245, 248–251, 292–298; 331/17, 11

[56] References Cited

U.S. PATENT DOCUMENTS

| | | | |
|---|---|---|---|
| 3,189,835 | 6/1965 | Marsh | 327/153 |
| 4,595,927 | 6/1986 | Menick | 327/147 |
| 4,626,787 | 12/1986 | Mefford | 327/156 |
| 4,661,721 | 4/1987 | Ushiku . | |
| 4,926,066 | 5/1990 | Maini et al. . | |
| 4,998,262 | 3/1991 | Wiggers | 327/261 |
| 5,043,596 | 8/1991 | Masuda et al. | 327/295 |
| 5,122,679 | 6/1992 | Ishii et al. | 327/147 |
| 5,216,302 | 6/1993 | Tanizawa | 307/603 |
| 5,223,755 | 6/1993 | Richley | 327/158 |
| 5,254,886 | 10/1993 | El-Ayat et al. . | |
| 5,258,660 | 11/1993 | Nelson et al. . | |
| 5,274,677 | 12/1993 | Ohuchi et al. . | |
| 5,361,277 | 11/1994 | Grover | 327/144 |
| 5,408,200 | 4/1995 | Buhler | 327/156 |
| 5,430,397 | 7/1995 | Itoh et al. | 327/295 |

Primary Examiner—Timothy P. Callahan
Assistant Examiner—T. Lam
Attorney, Agent, or Firm—Graham & James LLP

[57] ABSTRACT

A system clock signal is delivered to a plurality of load devices by means of a common loop filter and delay line and a plurality of phase detectors and charge pumps each associated to a different load. The delay line provides a plurality of substantially identical phase corrected clock signals, each clock signal being coupled to the associated load device via an associated conductor member. In one embodiment, each conductor member comprises a loop consisting of a pair of conductors having substantially identical path lengths. The phase adjusted clock signals on the proximal end of the outbound conductor are coupled back as a first feedback signal to one input of the associated phase detector. Another feedback signal comprises the clock signal returned from the device node along the second conductor of the pair. A third input to the phase detector is the system input clock signal, which is also coupled to a reference input of the delay line. Each phase detector/charge pump combination generates a phase error correction signal corresponding to any delay associated with a given loop and device. The plurality of phase error correction signals are averaged in a loop filter and delay line, so that each phase corrected clock signal output from the delay line contains the average correction for all of the delays. In an alternate embodiment, the return loop is eliminated so that a single feedback signal representative of the delay induced by each load device is coupled to one input of a conventional two input phase detector. In this embodiment, the load effect on the distributed clock signals is averaged out.

11 Claims, 3 Drawing Sheets

WHEN LOCKED:
$\Delta t1 = \Delta t2$

METHOD AND APPARATUS FOR AVERAGING CLOCK SKEWING IN CLOCK DISTRIBUTION NETWORK

BACKGROUND OF THE INVENTION

This invention relates to clock deskewing techniques used in synchronous electronic systems. In a synchronous electronic system, a master clock is normally provided which is used to synchronize the different components of the system requiring timed operation. In typical systems of this type, the master clock experiences delays along the distribution network, which results in loss of clock margin and potential errors. In the past, the normal solution employed to address this variable delay problem has been to slow down the master clock to accommodate delay variations. This solution suffers from the disadvantage that the entire system operation is prolonged, which slows down the processing time or operational time of the associated system circuits.

In order to attempt to provide a more suitable solution to the problem of variable clock delays, several techniques have been employed. One such technique employs a structured set of design rules in arranging the circuit components and clock path lengths to minimize delay variations from the clock source to the various load destinations. Another technique employed in the past provides a plurality of phase lock loops or delay line loops in order to provide zero delay buffers in the various clock distribution paths. In this approach, the phase lock loop or the delay line loop is used to buffer the clock in such a manner that the clock can be used locally without undergoing any delay. Still another technique employed in the past has been to use phase lock loops or delay line loops having a programmable delay output. In this approach, the system clock is provided as an input to the phase lock loop or the delay line loop, and the output of the clock buffer is a phase shifted version of the input system clock. The amount of the phase shift provided by the loop is programmed by the user so that any clock delay experience along the path can be pre-compensated.

The above known techniques for variable delay clock compensation all suffer from the disadvantage of requiring an accurate prediction of the amount of delay provided by each clock distribution path. In addition, the solution employing a structured set of design rules introduces a constraint on the circuit layout which is not always compatible with other operational requirements of a synchronous electronic system.

SUMMARY OF THE INVENTION

The invention comprises a method and apparatus for averaging clock skewing in a clock distribution network which does not require either a structured set of design rules or an estimate of the amount of variable delay introduced by a plurality of clock distribution paths. The invention averages the delay variation experienced along the various clock distribution branches, and produces an output such that the clocks delivered to the various load devices have a mean that is coincident with the system clock input. The invention is adaptive and can compensate for any time dependent variations in delay which might incur due to environmental changes, such as temperature changes, or load switching. In addition, the invention can be readily implemented at low cost using standard integrated circuit cells which are usually readily available from a library of such cells, such as charge pump, loop filter and delay line circuits.

From an apparatus standpoint, the invention comprises a clock deskewing circuit for synchronizing a clock signal at destination loads with a system clock by averaging delay variations along a plurality of clock distribution paths. The circuit comprises a first input terminal for receiving a system clock signal, a plurality of clock signal conductor members each having a proximal end and a distal end for providing a phase adjusted clock signal to an associated load device, a plurality of phase error correction signal generating circuits each coupled to the first input terminal and to the proximal end of a different one of the plurality of clock signal conductor members for generating a plurality of phase error correction signals each corresponding to a given load device and each providing a phase correction for any delay associated thereto, and averaging means coupled to the plurality of phase error correction signal generating circuits, the first input terminal, and the plurality of clock signal conductor members for generating a plurality of substantially identical phase adjusted clock signals each coupled to a different one of the plurality of clock signal conductor members and each incorporating the average of the plurality of phase error correction signals.

The plurality of phase error correction signal generating circuits each includes a phase detector circuit having a first input for receiving the system clock signal, a second input coupled to the corresponding clock signal conductor member for receiving a feedback signal representative of the delay associated to the load device, and an output; and a charge pump having an input coupled to the output of the phase detector circuit and an output coupled to the averaging means.

The averaging means includes a loop filter having an input coupled to the plurality of phase error correction signal generating circuits, and an output; and a delay line having a first input coupled to the output of the loop filter, and a second input coupled to the first input terminal, and a plurality of outputs each coupled to a different one of the plurality of signal conducting members.

In an alternate embodiment, each plurality of clock signal conductor members comprises a pair of conductors joined at the distal end, each conductor having a proximal end. The proximal end of one conductor in a given pair is coupled to the averaging means to receive one of the plurality of substantially identical phase adjusted clock signals, and is also coupled to the corresponding phase error correction signal generating circuit to provide a proximal clock feedback signal thereto. The proximal end of the other conductor in a given pair is coupled to the corresponding one of the plurality of phase error correction signal generating circuits to provide a distal clock feedback signal thereto. The path length of each conductor in a given pair is substantially equal. In this embodiment, each phase error correction signal generating circuit has the second input coupled to the one conductor of the corresponding clock signal conductor member and a third input coupled to the other conductor of the corresponding clock signal conductor member; and the averaging means output corresponding to the one clock signal conductor member is coupled to that same conductor.

The invention may be applied to implement on-chip deskewing or chip-to-chip clock deskewing; and the only additional design constraint imposed by the alternate embodiment of the invention is that the path length of the individual conductors of a given pair should be substantially equal.

For a fuller understanding of the nature and advantages of the invention, reference should be made to the ensuing

DETAILED DESCRIPTION OF THE PREFERRED EMBODIMENTS

Figure 1:
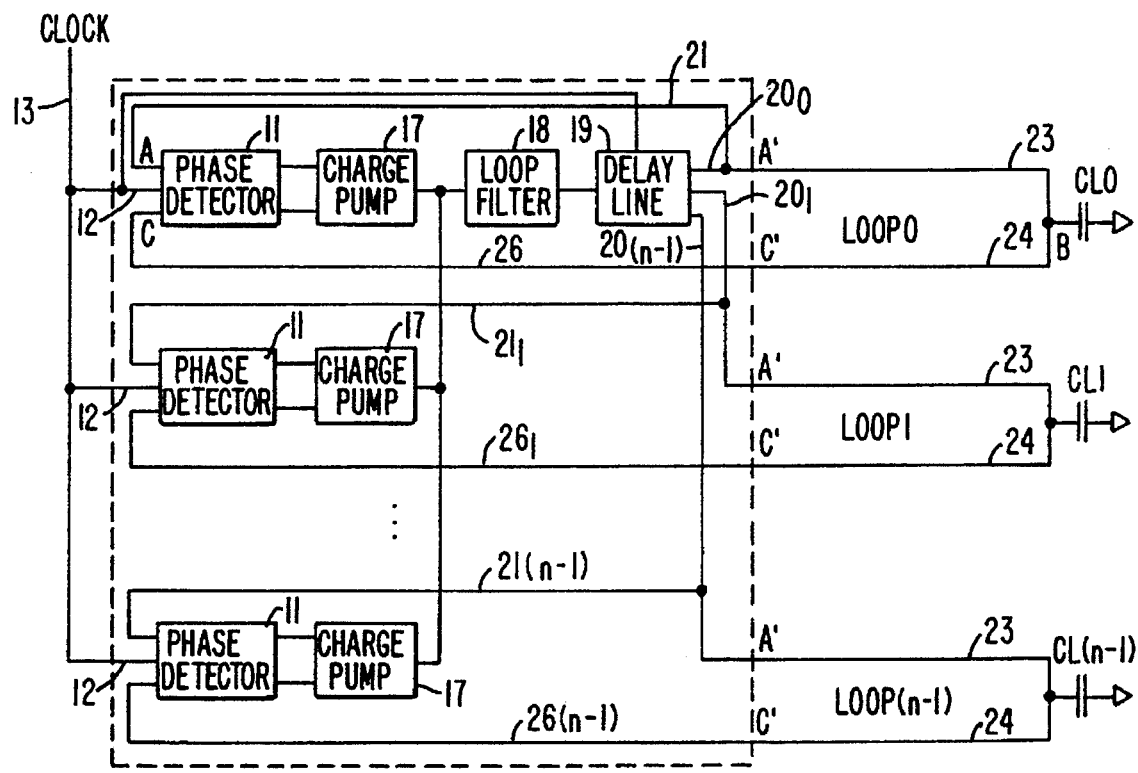
FIG. 1 is a block diagram illustrating a first embodiment of the invention.

Turning now to the drawings, FIG. 1 illustrates a block diagram of a first embodiment of the invention. As seen in this figure, a plurality of identical phase detectors are each provided with a first input terminal 12 to which a system clock signal is supplied along common conductor 13. Each phase detector 11 has the characteristics described below with reference to FIGS. 2 and 3. Each phase detector 11 has an associated charge pump 17. The outputs of each of the charge pumps 17 are coupled to the input of a conventional loop filter 18. The output of loop filter 18 is coupled to a first input of a delay line 19. System clock input terminal 12 is also coupled to a second input of delay line 19 as a reference signal.

Delay line 19 has a plurality of output terminals $20_0$, $20_1$, ..., $20_{(n-1)}$. The uppermost output of delay line 19 is coupled back along conductor 21 to a first feedback input terminal designated with reference letter A. Similarly, the output $20_1$ of delay line 19 is coupled back as a first feedback signal along conductive path $21_1$ to a first feedback input terminal of the adjacent phase detector 11. Thus, each phase detector 11 is provided with a first feedback signal from a dedicated and corresponding output from delay line 19.

Each output of delay line 19 is coupled to the proximal end A' of an outbound one of a pair of clock signal conductors 23, 24. Each clock signal conductor 23 is coupled at the distal end to a clock input terminal of an associated load device requiring a system clock input. This circuit connection point or node, designated with the reference letter B, is also coupled to the distal end of a corresponding inbound conductor 24. The proximal end C' of each conductor 24 is connected via a feedback conductor 26 to a second feedback input terminal of the corresponding phase detector 11, the second feedback input terminal being designated with the reference letter C.

Each of conductors 23 and 24 of an individual pair has the same path length so that the signal delay along an outbound conductor 23 is equal to the signal delay along an inbound conductor 24. The signal delay along conductor paths 21, 26 between their connection points to nodes A' and C' and input terminals A, C is considered negligible with respect to the signal delay along conductors 23 and 24. Consequently, these path lengths need not be equal.

In use, the proximal end feedback signal from a given node A' to the corresponding phase detector 11 comprises one immediate output of the delay line 19. The feedback input signal from a given node C', which is the distal end feedback, is the feedback clock signal after delivery to the destination load at device node B. The only constraint on the clock deskewing circuit layout in FIG. 1 is that the propagation delay from A' to B matches that from B to C' for any given pair of conductors 23, 24. However, the propagation delay may vary from pair to pair; i.e., the propagation delay along conductors 23, 24 of the uppermost loop may be different from that along conductors 23, 24 of the lowermost loop. Thus, conductors 23, 24 of different lengths may be used to couple the phase adjusted clock signals to the individual load device nodes B. This assumes that the delay from A' to A and C' to C is negligible compared to the delay from A' to B or from B to C' which is normally the case This delay matching can be readily accomplished in an integrated circuit environment by implementing conductors 23, 24 as a loop trace in which the path length from A' to B is identical to that from B to C'. One way of implementing this configuration is to provide a single metal trace having a width approximately three times the minimum metal conductor width, and forming a gap, e.g., by etching, in the single metal trace in order to form the loop.

Figure 2:
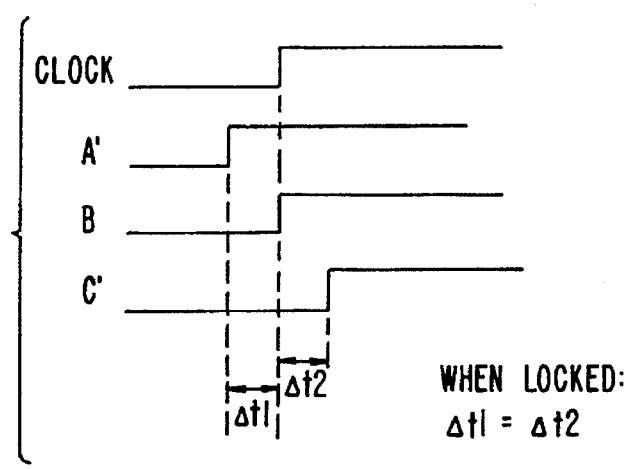
FIG. 2 is a timing diagram showing the phase relationships between the delay line output signal, the loop feedback signal and the input system clock.

In use, each pair of phase detectors 11 and charge pump 17 generates a phase error correction signal appropriate to the delay introduced by the associated loop and load device. Each of these error correction signals is then coupled via common loop filter 18 to delay line 19 in order to control the amount of delay in accordance with the average of all the individual phase error correction signals. Delay line 19 produces essentially identical phase adjusted clock output signals each incorporating the average of all of the delay correction signals. In this way, the phase adjusted clock signals delivered to the various load devices along conductors 23 have a mean that is coincident with the system clock input on conductor 13. FIG. 2 is a clock signal diagram showing the relative positions of the clock signal on input terminal 12, the proximal feedback clock signal on node A' and the distal feedback clock signal on node C' for any one of the loop circuits shown in FIG. 1 assuming identical lengths for all loops. With reference to FIG. 2, phase detector 11 functions to provide correction signals to the charge pump 17 such that, when the associated loop is in lock, the clock input is centered equally between the feedback signal inputs A and C. This is automatically done by phase detector 11 by feeding the appropriate error correction signal to the charge pump 17. Since the clock signal at node B is also centered in phase between the clock signals on nodes A' and C' the clock signal at node B will be synchronized with the input clock signal.

Figure 3:
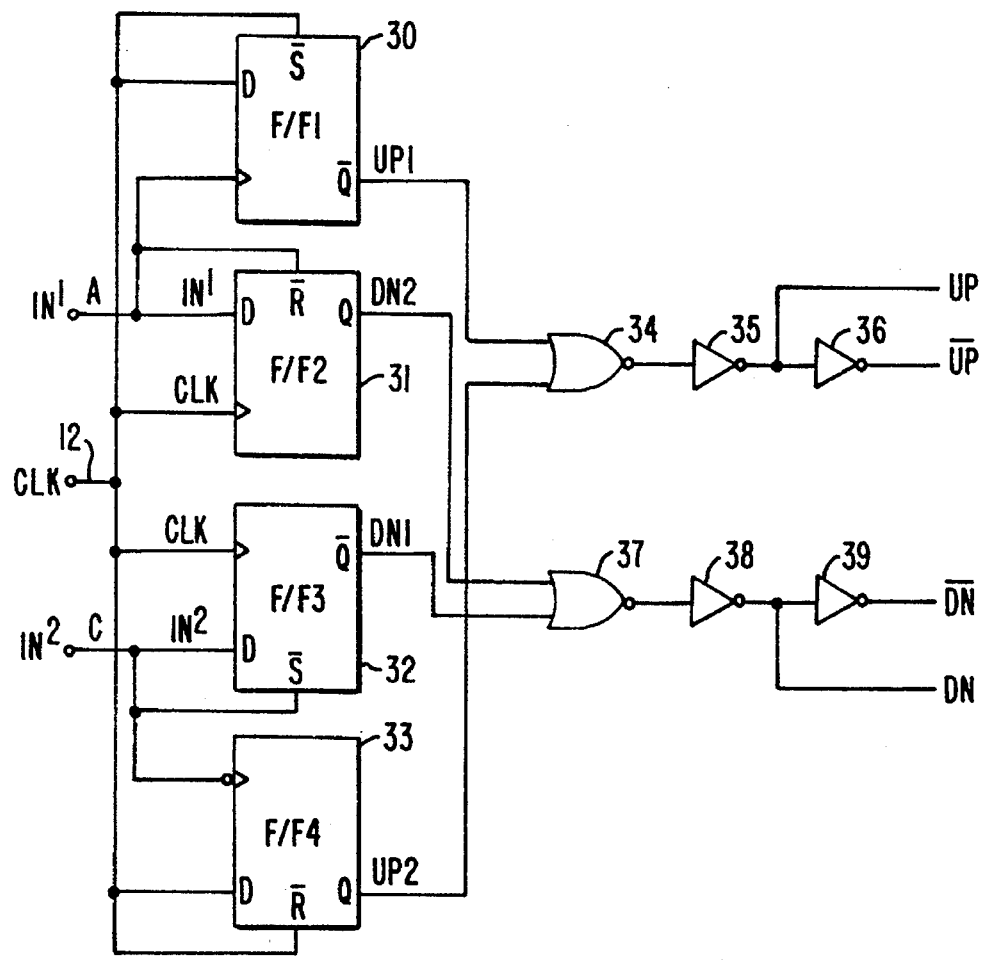
FIG. 3 is a logic diagram of an embodiment of phase detector 11.

FIG. 3 illustrates an embodiment of phase detector 11 capable of providing the error correction signals required to achieve loop lock in the manner described above. With reference to FIG. 3, four D-type flip-flops 30–33 are configured as shown. Thus, system clock input terminal 12 is coupled to the D input of flip-flops 30 and 33, and to the clock inputs of flip-flops 31, 32. Proximal clock signal feedback terminal A is coupled to the clock input of flip-flop 30 and the D input of flip-flop 31. Distal clock signal feedback terminal C is coupled to the D input of flip-flop 32 and the clock input of flip-flop 33. System clock input terminal 12 is further coupled to the set input of flip-flop 30 and the reset input of flip-flop 33. Proximal clock signal feedback terminal A is also coupled to the reset input of flip-flop 31. Distal clock signal feedback terminal C is also coupled to the set input of flip-flop 32.

The $\overline{Q}$ output of flip-flop 30 is coupled to a first input of an inverting or gate 34. The Q output of flip-flop 33 is coupled to the other input of gate 34. The output of gate 34 is coupled to the input of an inverter 35. The output of inverter 35 is coupled to the input of a second inverter 36.

Similarly, the Q output of flip-flop 31 is coupled to a first input of an inverting or gate 37; and the $\overline{Q}$ output of flip-flop 32 is coupled to the other input of gate 37. The output of gate 37 is coupled to the input of an inverter 38, and the output of inverter 38 is coupled to the input of a second inverter 39.

Flip-flops 30, 33 provide error steering signals designated UP1, UP2, which are buffered by gate 34 and inverters 35, 36 to provide the error correction signals UP and $\overline{UP}$, which are coupled to charge pump 17 and introduce additional delay in delay line 19 for the clock signals passing therethrough. Similarly, flip-flops 31, 32 provide the down steering signals DN2, DN1, which are buffered by gate 37 and inverters 38, 39 to provide the down signals DN, $\overline{DN}$, which are coupled to charge pump 17 and reduce the delay in delay line 19 for the clock signals passing therethrough.

Figure 4:
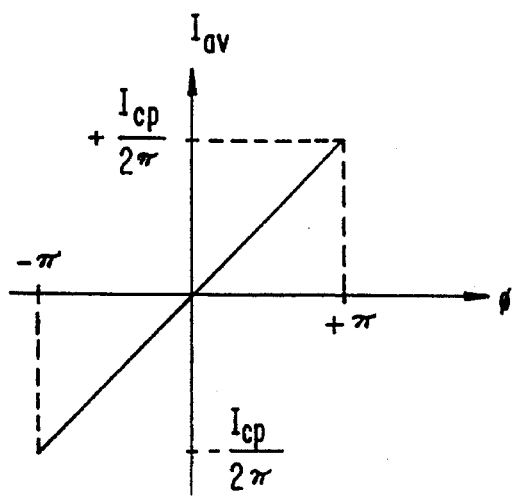
FIG. 4 is a diagram showing the transfer function of phase detector 15 and charge pump 17.

FIG. 4 illustrates the transfer function of the phase detector 11 and associated charge pump 17. In FIG. 4, the abscissa represents the phase error, while the ordinate represents the amount and direction of current associated to a particular degree of phase error. As can be seen, the function is linear and ranges over one full cycle (360°).

Figure 5:
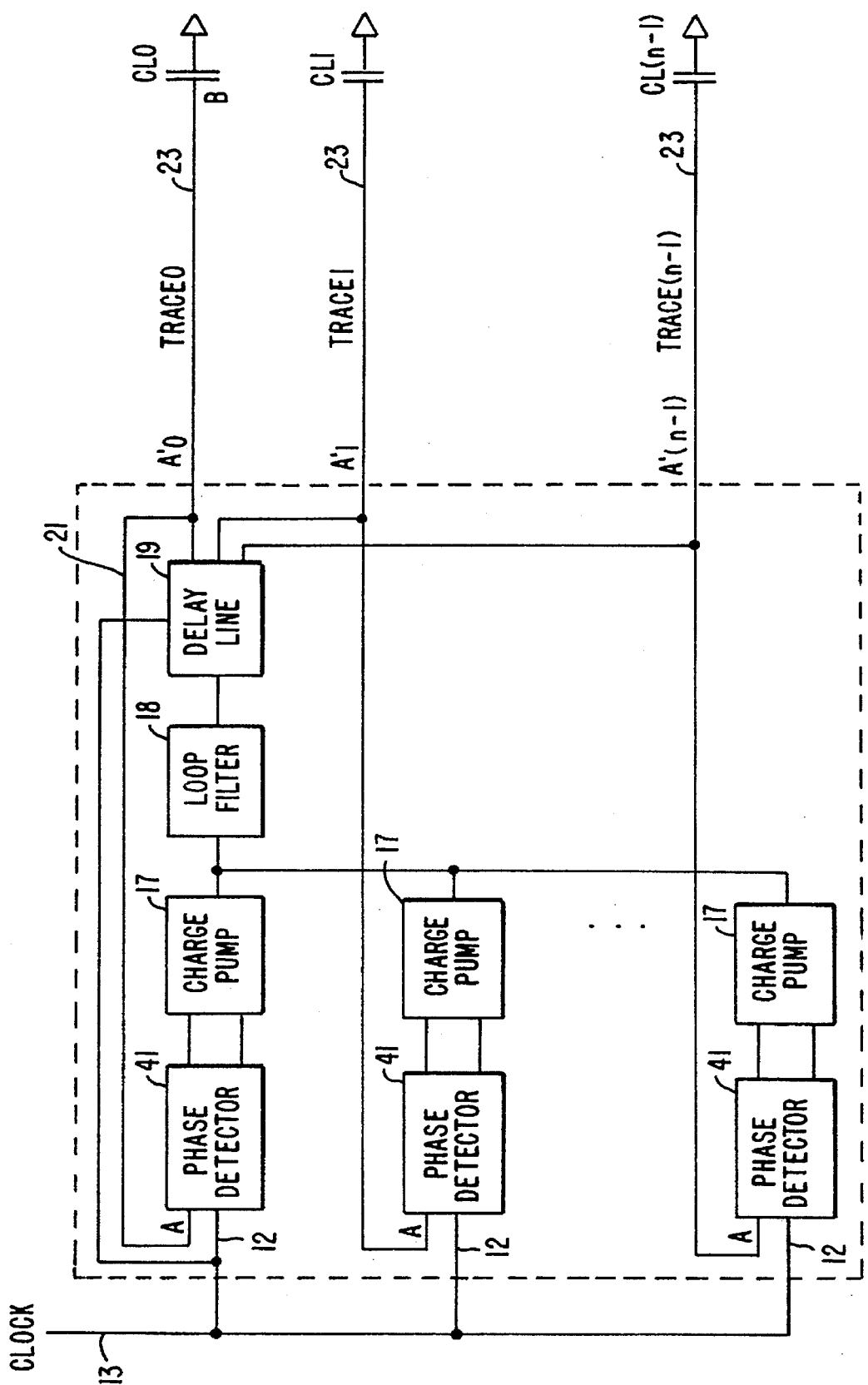
FIG. 5 is a block diagram of a second embodiment of the invention employing outbound only clock signal conductors.

FIG. 5 illustrates an alternate embodiment of the invention in which the feedback conductors 24 from the device nodes B are eliminated. In this embodiment, conventional two input phase detectors 41 are employed to generate the steering signals for each associated charge pump 17. In this embodiment, any delay due to the propagation time along the individual conductors does not contribute to the error correction signal; however, the delay due to the load effect of each device does contribute to the phase correction signal generated by the combination of each phase detector 41 and charge pump 17, and these error correction signals are averaged by loop filter 18 and delay line 19.

As will now be apparent, the above invention can be readily implemented using conventional integrated circuit techniques and standard cell libraries in integrated circuits requiring a synchronized clock. It should be noted that the invention may be applied to implement on-chip clock deskewing or chip-to-chip clock deskewing in which a master clock chip employing the invention may be used to distribute the clock signal to other chips in the system. In an on-chip clock deskewing implementation, the phase detectors 11, 41, charge pumps 17, loop filter 18, delay line 19, clock signal conductors 23, 24 and input terminal 12 are all located on the same integrated circuit chip. In a chip-to-chip implementation, the phase detectors 11, 41, charge pump 17, loop filter 18, delay line 19, and input terminal 12 are all located on a single integrated circuit chip, and at least portions of the clock signal conductors 23, 24 extend from this chip to the other chips in the system. If desired, the master clock generator may also be incorporated onto the single integrated circuit chip. The structure and function of the individual elements 17, 18, 19, 31, 32 and 41 are conventional and thus have not been described in detail in order to avoid prolixity.

The invention affords a number of advantages over known clock deskewing techniques. Firstly, the only constraint on the path length and placement imposed by the invention is that the path length of the outbound conductor 23 in the feedback loop embodiment of FIG. 1 must closely match the path length of the corresponding inbound conductor 24. Compliance with this constraint is relatively simple, for example, by forming a given conductor pair 23, 24 from a single trace in the manner noted above. Consequently, there are no rigid design rules which must be adhered to in order to ensure the delivery of averaged clock signals to the load device nodes B. In addition, any phase delays introduced by the individual load devices are automatically averaged by virtue of the distal feedback clock signal from each load device node B to the distal clock signal feedback input terminal C in the FIG. 1 embodiment, and by virtue of the feedback clock signal from the proximal end A' of each individual trace 23 in the FIG. 5 embodiment. Lastly, the invention is stable over a wide range of environmental conditions, and thus provides adaptive clock deskewing.

While the above provides a full and complete understanding of the nature and advantages of the invention, various modifications, alternate constructions and equivalents may be employed, as desired. For example, although the invention has been described with reference to implementations employing delay lock loops, the invention may be employed with phase lock loops having a voltage controlled oscillator instead of a delay line. Consequently, the above should not be construed as limiting the invention, which is defined by the appended claims.

What is claimed is:

1. A clock deskewing circuit for synchronizing a clock signal at destination loads with a system clock by averaging delay variations along a plurality of clock distribution paths, said circuit comprising:

a first input terminal for receiving a system clock signal;

a plurality of clock signal conductor members each having a proximal end and a distal end for providing a phase adjusted clock signal to an associated load device;

a plurality of phase error correction signal generating circuits each coupled to said first input terminal and to the proximal ends of said plurality of clock signal conductor members for generating a plurality of phase error correction signals each corresponding to the associated load device and each providing a phase correction for any delay associated thereto; and averaging means coupled to said plurality of phase error correction signal generator circuits, said first input terminal and said plurality of clock signal conductor members for generating a plurality of substantially identical phase adjusted clock signals each coupled to a different one of said plurality of clock signal conductor members and each incorporating an average of the plurality of phase error correction signals.

2. The invention of claim 1 wherein said plurality of phase error correction signal generating circuits each includes a phase detector circuit having a first input for receiving the system clock signal, a second input coupled to the corresponding clock signal conductor member for receiving a feedback signal representative of the delay associated to the load device, and an output; and a charge pump having an input coupled to the output of said phase detector circuit and an output coupled to said averaging means.

3. The invention of claim 1 wherein said averaging means includes a loop filter having an input coupled to said plurality of phase error correction signal generating circuits, and an output; and a delay line having a first input coupled to the output of said loop filter, a second input coupled to said first input terminal and a plurality of outputs each coupled to a different one of said plurality of signal conducting members.

4. The invention of claim 1 wherein said plurality of clock signal conductor members each comprises a pair of conductors joined at the distal end with each conductor having a path length and a proximal end, the proximal end of one conductor in a given pair being coupled to said averaging means to receive one of said plurality of substantially identical phase adjusted clock signals, said proximal end also being coupled to the corresponding one of said plurality of phase error correction signal generating circuits to provide a proximal clock feedback signal thereto, the proximal end of the other conductor in the given pair being coupled to the corresponding one of said plurality of phase error correction signal generating circuits to provide a distal clock feedback signal thereto, the path lengths of each conductor in the given pair being substantially equal.

5. The invention of claim 4 wherein said plurality of phase error correction signal generating circuits each includes a phase detector circuit having a first input for receiving the system clock signal, a second input for receiving said proximal clock feedback signal, a third input for receiving said distal clock feedback signal, and an output; and a charge pump having an input coupled to the output of said phase detector circuit and an output coupled to said averaging means.

6. The invention of claim 4 wherein said averaging means includes a loop filter having an input coupled to said plurality of phase error correction signal generating circuits, and an output; and a delay line having a first input coupled to the output of said loop filter, a second input coupled to said first input terminal, and a plurality of outputs each coupled to a different said one conductor of said plurality of signal conducting members.

7. The invention of claim 1 wherein said first input terminal, said plurality of clock signal conductor members, said plurality of phase error correction signal generating circuits and said averaging means are all located on a single integrated circuit chip to provide on-chip deskewing of the system clock.

8. The invention of claim 1 wherein said plurality of phase error correction signal generating circuits and said averaging means are all located on a master clock integrated circuit chip; and wherein said plurality of clock signal conductor members include segments extending from said master clock integrated circuit chip to other integrated circuit chips in order to provide chip-to-chip clock deskewing.

9. A clock deskewing circuit for substantially deskewing a clock signal, the apparatus comprising:

at least a first and a second phase detectors each having a clock terminal for receiving a clock signal and a feedback terminal;

at least a first and a second charge pumps coupled to the first and second phase detectors, respectively, for providing at least a first and a second phase error correction signals, respectively;

a delay line coupled to at least the first and second charge pumps, the delay line having a clock signal input configured for receiving the clock signal, the delay line having at least a first and a second outputs for coupling a delayed clock signal to at least a first and second loads, respectively, the first output of the delay line coupled to the feedback terminal of the first phase detector, the second output of the delay line coupled to the feedback terminal of the second phase detector for providing to the first and second loads, respectively, a phase delayed clock signal that is based on an average of at least the first and second phase error correction signals.

10. A method for providing a clock deskewing circuit for substantially synchronizing a clock signal at destination loads with a system clock by averaging delay variations along a plurality of clock distribution paths, the method comprising the steps of:

providing a first input terminal for receiving a system clock signal;

providing a plurality of clock signal conductor members each having a proximal end and a distal end for providing a phase adjusted clock signal to an associated load device;

providing a plurality of phase error correction signal generating circuits each coupled to said first input terminal and to the proximal ends of said plurality of clock signal conductor members for generating a plurality of phase error correction signals each corresponding to the associated load device and each providing a phase correction for any delay associated thereto; and providing averaging means coupled to said plurality of phase error correction signal generator circuits, said first input terminal and said plurality of clock signal conductor members for generating a plurality of substantially identical phase adjusted clock signals each coupled to a different one of said plurality of clock signal conductor members and each incorporating an average of the plurality of phase error correction signals.

11. A method for providing a clock deskewing circuit for substantially synchronizing a clock signal at destination loads with a system clock signal, the method comprising the steps of:

receiving the system clock signal on a conductor;

generating at least a first and a second phase error correction signal based on phase differences between the system clock signal and at least a first and a second clock signal associated with the destination loads, respectively;

generating an average of at least the first and the second phase error correction signals;

coupling the average to a delay line for providing at least a first and a second substantially in phase clock signals to at least the first and the second destination loads, respectively.

\* \* \* \* \*